(12) United States Patent  
Amin et al.

(10) Patent No.: US 8,767,456 B2
(45) Date of Patent: *Jul. 1, 2014

(54) MULTI-BIT MEMORY WITH SELECTABLE MAGNETIC LAYER

(75) Inventors: Nurul Amin, Woodbury, MN (US); Johannes Van Ek, Niwot, CO (US)

(73) Assignee: Seagate Technology LLC, Scotts Valley, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/473,448

(22) Filed: May 16, 2012

(65) Prior Publication Data

US 2012/0224418 A1 Sep. 6, 2012

Related U.S. Application Data

(63) Continuation of application No. 12/900,314, filed on Oct. 7, 2010, now Pat. No. 8,199,570.

(51) Int. Cl.
*G11C 11/15* (2006.01)

(52) U.S. Cl.
USPC ............ 365/173; 365/131; 365/158; 365/171

(58) Field of Classification Search
USPC ................... 365/131, 158, 171, 173
See application file for complete search history.

(56) References Cited

U.S. PATENT DOCUMENTS

| 5,930,164 | A | 7/1999 | Zhu |
| 6,777,113 | B2 * | 8/2004 | Trindade et al. .............. 428/829 |
| 6,985,385 | B2 | 1/2006 | Nguyen et al. |
| 7,164,177 | B2 | 1/2007 | Chang et al. |
| 7,426,091 | B2 * | 9/2008 | Okada et al. ............. 360/125.03 |
| 8,072,800 | B2 | 12/2011 | Chen et al. |
| 8,124,257 | B2 | 2/2012 | Tsuda |
| 2007/0064342 | A1 * | 3/2007 | Nakamura et al. ............ 360/119 |
| 2012/0026626 | A1 | 2/2012 | Nolan et al. |

* cited by examiner

*Primary Examiner* — Fernando Hidalgo
(74) *Attorney, Agent, or Firm* — Hall Estill Attorneys at Law

(57) ABSTRACT

An apparatus and associated method for a multi-bit memory capable of being selected with a magnetic layer. Various embodiments of the present invention are generally directed to a first selection layer with a low coercivity that is disposed between first and second storage layers that each have a high coercivity. In response to magnetic saturation of the first selection layer, programming of a logical state to the second storage layer is allowed.

20 Claims, 5 Drawing Sheets

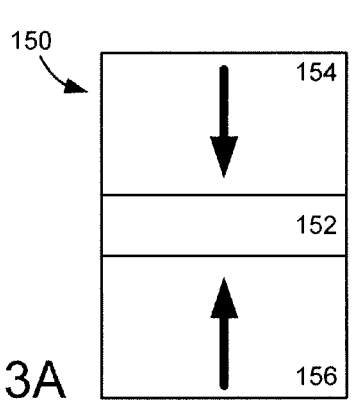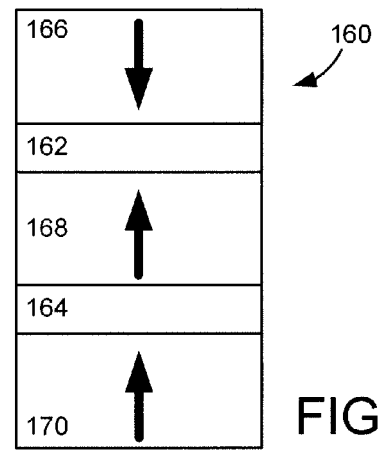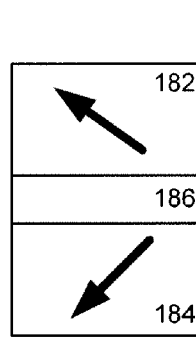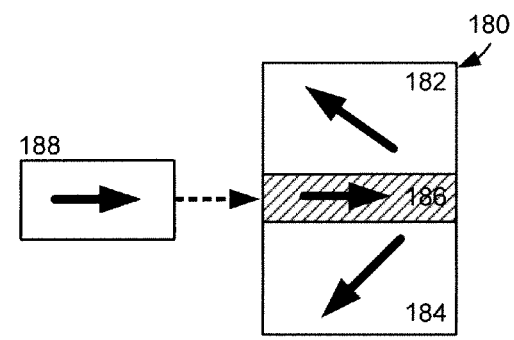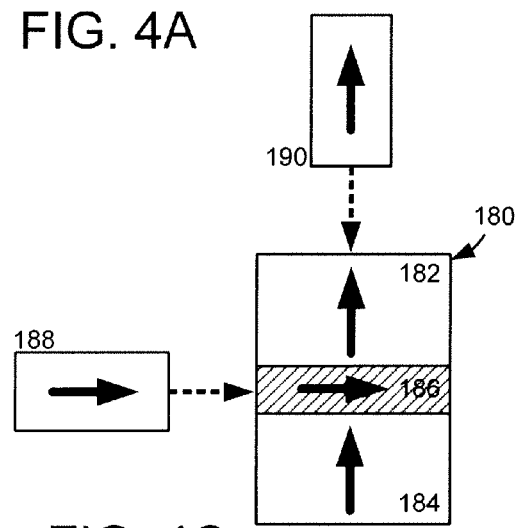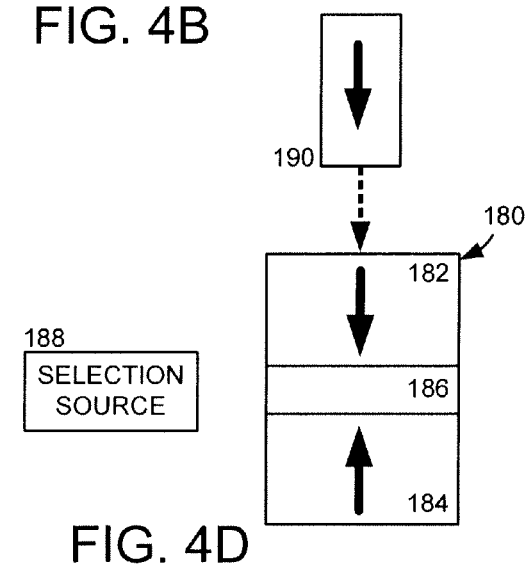

US 8,767,456 B2

MULTI-BIT MEMORY WITH SELECTABLE MAGNETIC LAYER

RELATED APPLICATION

This application is a continuation of copending U.S. patent application Ser. No. 12/900,314 filed Oct. 7, 2010.

SUMMARY OF THE INVENTION

Various embodiments of the present invention are generally directed to a multi-bit memory capable of being accessed with a selectable magnetic layer.

Various embodiments of the present invention are generally directed to a first selection layer with a low coercivity that is disposed between first and second storage layers that each has a high coercivity. In response to magnetic saturation of the first selection layer, programming of a logical state to the second storage layer is allowed.

These and other features and advantages which characterize the various embodiments of the present invention can be understood in view of the following detailed discussion and the accompanying drawings.

BRIEF DESCRIPTION OF THE DRAWINGS

FIGS. 3A and 3B generally illustrate block representations of exemplary multi-bit memory capable of use in the data storage devices of FIGS. 1 and 2.

FIGS. 4A-4D shows the multi-bit memory of FIG. 3A in various exemplary stages of operation conducted in accordance with various embodiments.

DETAILED DESCRIPTION

The present disclosure generally relates to multi-bit memory that is accessible with a selectable magnetic layer. As data storage devices are becoming ever smaller, industry is driving data capacity to increase while maintaining high data transfer rates and integrity. Data storage devices can employ a variety of structures and processes to increase data capacity, but reduced form factors limit both manufacturing and operational tolerances at the expense of data integrity. As the data storage devices have shrunk, industry has pursued storing multiple bits of data at each data storage location in the device.

Accordingly, a multi-bit memory can be achieved by positioning a pair of data storage layers on opposite sides of a magnetic selection layer that, when magnetically saturated, allows programming of a logical state to one of the data storage layers. By positioning the magnetic selection layer between the storage layers, a particular storage layer can be individually programmed after magnetically saturating the selection layer. Such a multi-bit memory in which each bit can be selectively programmed provides an increase in data storage capacity without hindering data transfer rates, manufacturing processes, or data integrity.

Figure 1:
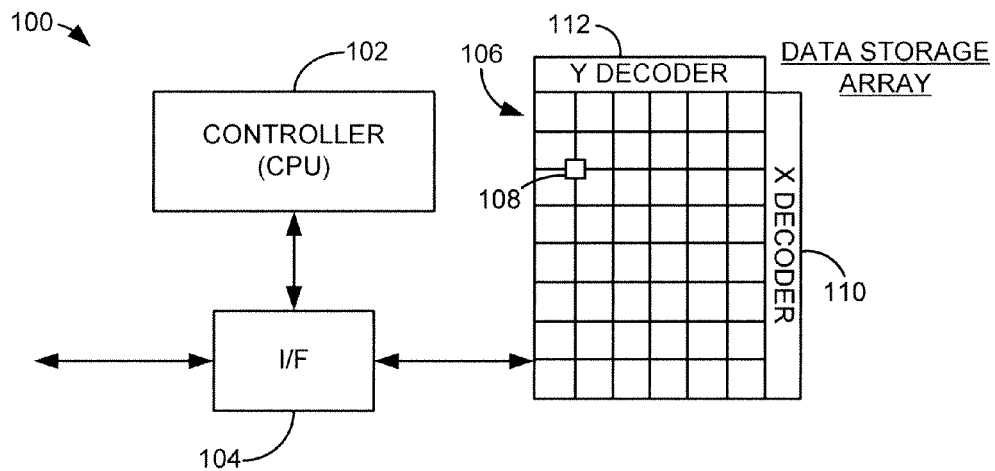
FIG. 1 is a general representation of an exemplary circuitry used to read and write data to a data storage device as constructed and operated in accordance with various embodiments of the present invention.

FIG. 1 generally provides a functional block representation of a data storage device 100 constructed and operated in accordance with various embodiments of the present invention. The device 100 includes a top level controller 102, an interface (I/F) circuit 104 and a data storage array 106. The I/F circuit 104 operates under the direction of the controller 102 to transfer user data between the array 106 and a host device (not shown).

In some embodiments, the device is characterized as a solid-state drive (SSD), the controller 102 is a programmable microcontroller, and the array 106 comprises an array of nonvolatile memory cells 108. In other embodiments, the data storage array 106 can have separate X and Y decoders 110 and 112, respectively, to provide access to selected memory cells 108. However, the configuration and operation of the various components of the data storage device 100 are not required or limited and can be modified, as desired.

Figure 2:
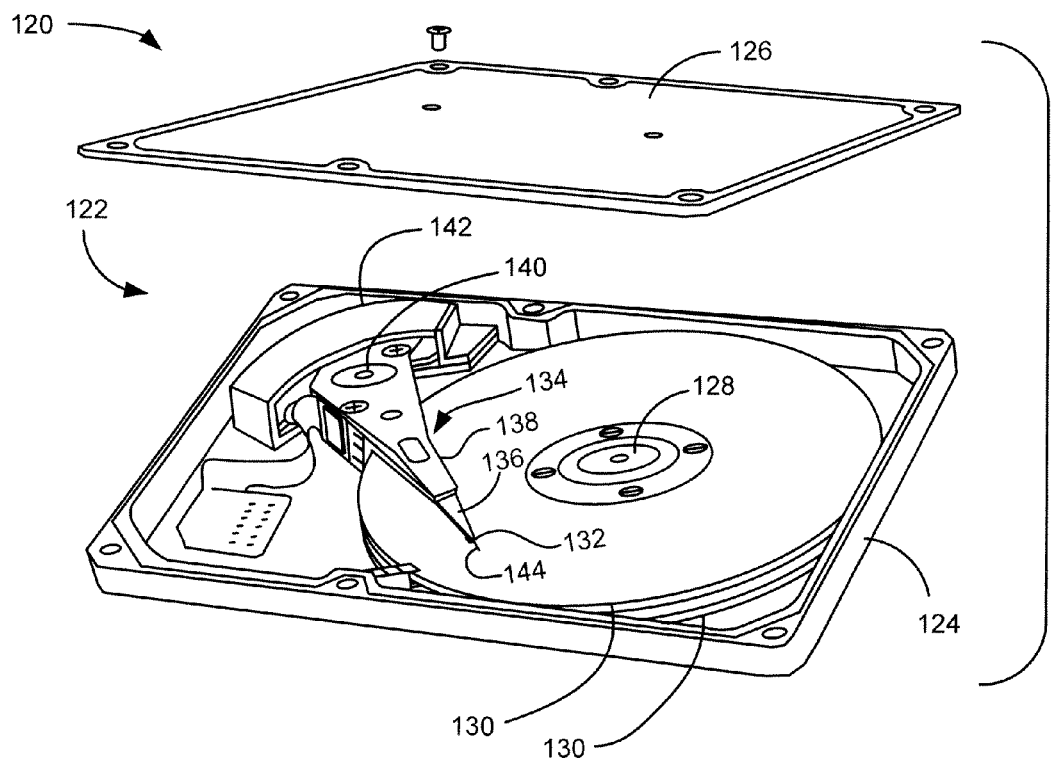
FIG. 2 is a perspective view of an exemplary data storage device.

Another exemplary data storage device 120 is provided in FIG. 2. The device 120 shows an exemplary environment in which various embodiments of the present invention can be advantageously practiced. It will be understood, however, that the claimed invention is not so limited to rotating storage media, such as the SSD shown in FIG. 1.

The device 120 includes a substantially sealed housing 122 formed from a base deck 124 and top cover 126. An internally disposed spindle motor 128 is configured to rotate a number of magnetic storage media 130. The media 130 are accessed by a corresponding array of data transducers (read/write heads) that are each supported by a head gimbal assembly (HGA) 112. Each HGA 132 can be supported by a head-stack assembly 134 ("actuator") that includes a flexible suspension 136, which in turn is supported by a rigid actuator arm 138. The actuator 134 preferably pivots about a cartridge bearing assembly 140 through application of current to a voice coil motor (VCM) 142. In this way, controlled operation of the VCM 142 causes the transducers (numerically denoted at 144) to align with tracks (not shown) defined on the media surfaces to store data thereto or retrieve data therefrom.

While the data storage devices 100 and 120 of FIGS. 1 and 2 vary in some structural and operational parameters, the use of magnetic memory to store data is consistently used. One such magnetic memory that can be utilized in each storage device 100 and 120 is a multi-bit memory which can store a plurality of magnetic orientations that correspond with multiple logical states. The storage of numerous logical states allows each storage device 100 and 120 to store a multiple of the previous single bit memory without increasing the density of memory in the array 106 or on the media 130.

FIGS. 3A and 3B generally illustrate multi-bit memory constructed in accordance with various embodiments of the present invention. FIG. 3A displays a multi-bit memory 150 capable of dual bit storage. The memory 150 has a magnetic selection layer 152 disposed between first and second storage layers 154 and 156 that are each capable of being programmed with, and subsequently retaining, a predetermined magnetic orientation. As can be appreciated, the presence of dual magnetic storage layers 154 and 156 allows for four logical states to be stored and read instead of the conventional two logical states commonly associated with single bit memory.

The multi-bit memory, however, is not limited to dual bit storage, as shown by the triple bit storage of multi-bit memory 160 in FIG. 3B. Storage of three distinct bits of memory is enabled by two magnetic selection layers 162 and 164 that are each disposed between two of the three storage layers 166, 168, and 170. The magnetic selection layers of either multi-bit memory 150 or 160 allow the selective programming of predetermined storage layers by being configurable as either a magnetic shield or conductor. That is, the selection layers 152, 162, and 164 can be a soft magnetic material with low coercivity which exhibit magnetic shielding in the absence of magnetic saturation and magnetic conductivity in the presence of magnetic saturation.

The magnetic saturation and consequential magnetic conductivity of a particular selection layer allows for the selection of a storage layer for logical bit reading or programming. For example, magnetic saturation of the selection layer 152 allows for a logical state to be programmed to both storage layers 154 and 156 concurrently. Conversely, a lack of saturation in the selection layer 152 shields programming from the second storage layer 156 and allows for the individual programming of the first storage layer 154. Such individual programming of the dual bits provides four distinct logical states for multi-bit memory 150 and eight logical states for multi-bit memory 160.

The ability to single out a particular storage layer in a multi-bit memory can provide further benefits of reducing programming time and energy by programming both storage layers to a common magnetic orientation. In practice, the storage layers can be constructed of hard magnetic material with high coercivity that can be programmed concurrently to a common magnetic orientation, which serves to program two or more bits in a single step, thereby eliminating subsequent programming time and energy.

While each multi-bit memory can have a common magnetic orientation for each storage layer, the ability to individually program storage layers allows for dissimilar orientations, and corresponding logical states, to be present in the various layers. FIGS. 4A-4D generally display various exemplary steps to individually select and program various bits in a multi-bit memory 180 in accordance with various embodiments of the present invention.

The multi-bit memory 180 has a pair of high magnetic coercivity storage layers 182 and 184 separated by a low magnetic coercivity selection layer 186. Each storage layer is displayed in FIG. 4A with a different magnetic orientation that is not limited and should be regarded as random magnetizations. In FIG. 4B, the selection layer 186 is saturated with magnetization from a selection source 188. In some embodiments, the selection source 188 is contactingly adjacent with some or all of the memory 180 and saturates the selection layer 186 by passing current through the layer in a predetermined direction. Meanwhile in other embodiments, the selection source 188 is merely adjacent the selection layer 186 and saturates the layer with a predetermined magnetic field.

It should be noted that the magnetic saturation of the selection layer 186 does not affect the random magnetizations of the storage layers 182 and 184. However, such saturation provides a magnetic conductor that allows a programming source 190 to concurrently set the magnetic orientation of each storage layer 182 and 184, as shown in FIG. 4C. As discussed above, the memory 180 is programmed with two logical states (bits of data) after the step shown in FIG. 4C, but further programming is needed to set different magnetizations in the storage layers.

FIG. 4D illustrates the additional programming as the selection source 188 no longer saturates the selection layer 186 which subsequently acts as a magnetic shield against magnetization from the programming source 190 from reaching the second storage layer 184. As such, the removal of magnetic energy from the selection source 188 induces the selection layer 186 to become magnetically unsaturated and act to prevent programming of the storage layer 184 distal to the programming source 190. The desaturation of the selection layer 186 does not inhibit, however, the magnetic receptivity of the first storage layer 182, which can be programmed to a magnetic orientation opposite of the second storage layer 184.

The high coercivity of the storage layers 182 and 184 allows the memory 180 to maintain programmed magnetic orientations in each storage layer, in contrast to the low coercivity of the selection layer 186 that returns to a default desaturated magnetic state with the removal of magnetic energy. Thus, the memory 180 is non-volatile with a plurality of bits that can be programmed individually or in combination.

Furthermore, the multiple bits of data stored in the memory 180 are capable of being read individually or in combination. Various magnetic sensing devices can detect programmed magnetizations of the storage layers 182 and 184 through field sensing, such as with magnetoresistive and Hall effect sensors, as well as with current sensing. Reading the memory 180 can be controlled similarly to the programming steps with the magnetic saturation of the selection layer 186 controlling the detection of the magnetization of the second storage layer 184. Therefore, one or all storage layers can be selected and read by the various sensing devices.

While the multi-bit memory 180 has dual storage layers that correspond with data bits, the various steps shown in FIGS. 4A-4D can be similarly used to program a multi-bit memory with any number of bits, such as the triple bit memory of FIG. 3B. Programming and reading of such memory with more than one selection layer have the additional steps of magnetically saturating the various selection layers to allow flow of magnetizations throughout the memory. Hence, less than all the selection layers of a memory can be saturated to allow programming or reading of less than all the available storage layers.

Figure 5:
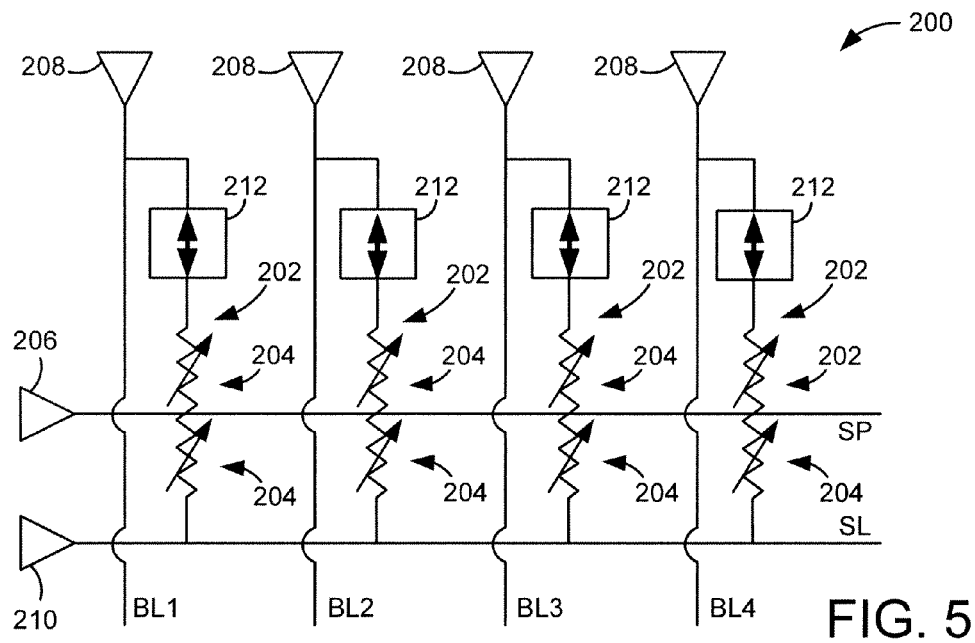
FIG. 5 is a schematic view of an exemplary portion of an array of multi-bit memory constructed and operated in accordance with various embodiments.

The ability to enhance data storage capacity with minimal increase in physical size makes multi-bit memory a particularly good candidate for a variety of data storage device applications. FIG. 5 displays an exemplary page 200 portion of an array of multi-bit memory in which each memory cell 202 has at least two storage layers 204 that correspond to distinct data bits. Each cell 202 has a selection layer that is connected to a selection driver 206 that simultaneously saturates each layer of the array 200.

With the selection driver 206 activating each cell 202, reading and programming of specific cells can be done by activating certain bit and source line drivers 208 and 210 that provide a circuit pathway through particular cells 202 with bit lines (BL) and source lines (SL). As shown, each bit line can trigger a programming source 212 connected to each cell 202 to set the magnetization of the respective storage layers 204, as desired.

In some embodiments, each cell 202 is configured with a secondary programming source proximal to the source line so that each programming source (both above the cell and below the cell) is configured to program a single magnetic orientation through the cell and the need for a bipolar programming source is eliminated. In other embodiments, the bit line drivers 208 write data to the cells 202 while the source line driver 210 reads data by sending a read current through one or more cells to sense the logical states.

Figure 6:
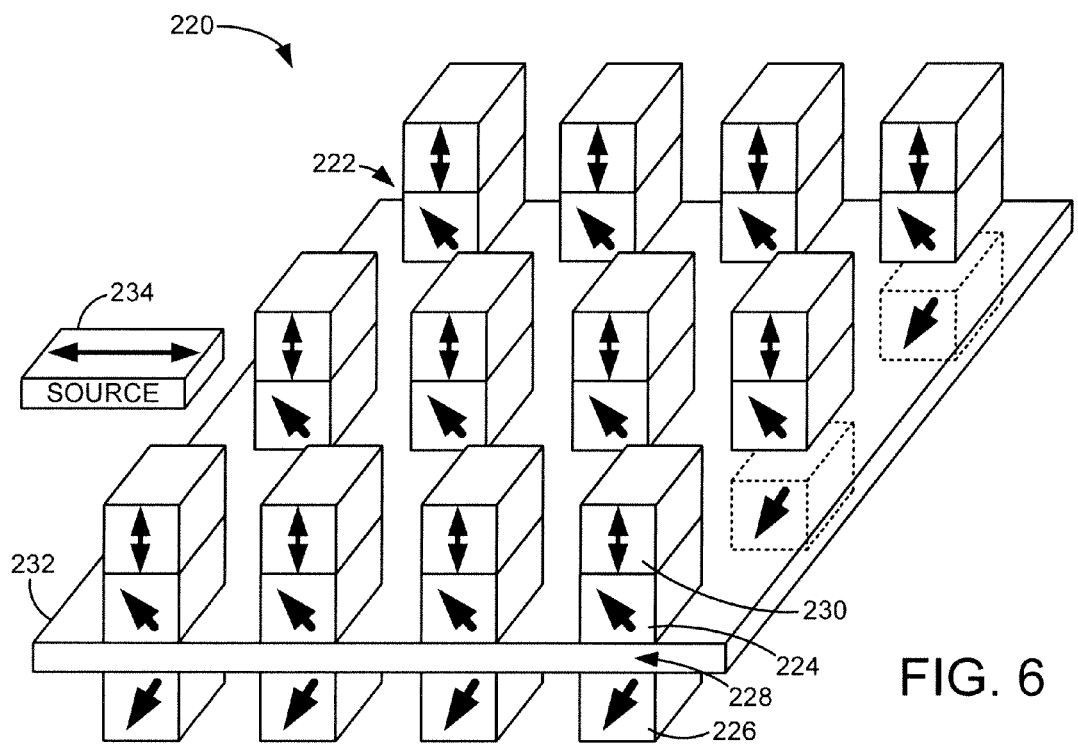
FIG. 6 illustrates an isometric view of an array of multi-bit memory.

FIG. 6 provides an isometric representation of an exemplary solid state array 220 in which each memory cell 222 has a pair of storage layers 224 and 226 separated by a selection layer 228 and connected to a programming source 230 through a predetermined storage layer 224. As discussed above, the bipolar programming source 230 is not required as each storage layer 224 and 226 can be attached to unipolar programming sources on opposite sides of the selection layer 228. The array 200 is interconnected by the selection plane 232 that is made of all the selection layers 228 of the cells 222.

The selection plane 232 can be continuous material or an interconnected grid of conductive pathways that allow for simultaneous magnetic saturation of each cell 222 with a selection source 234. It is contemplated that the array 220 has various bit and source line pathways, such as the line pathways of FIG. 5, that allow for individual reading and writing of the cells 220.

The solid state page 200 of FIG. 5 and array 220 of FIG. 6 provides several operational efficiencies due to the interconnected electrical structure of each cell. Various logical states with different values can be quickly written to one or every storage layer 204 in the array 220 with the efficient activation of the selection driver 206 and the concurrent programming of data from the bit line drivers 208. Meanwhile, reading of the array 220 can be facilitated with various processes, such as page burst and multiplexing, that maximize efficiency while providing reliable data readback.

Figure 7:
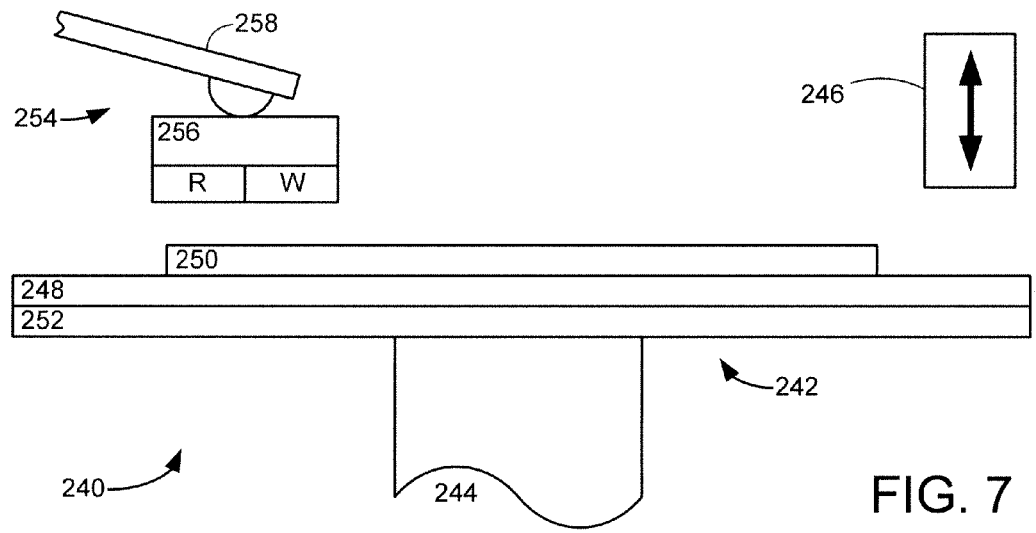
FIG. 7 displays an exemplary environment in which multi-bit memory can be implemented in accordance with various embodiments of the present invention.

However, multi-bit memory also has practical benefits when utilized in rotating storage media, such as the data storage device 120 of FIG. 2. A side view of a portion of an exemplary rotating storage device 240 is shown in FIG. 7 which includes a rotating media 242 configured to rotate about a central axis of an attached spindle 244. The media 242 is further configured with multiple diameters to allow one or more selection source(s) 246 access to a magnetic selection layer 248 disposed between data storage layers 250 and 252.

With the selection layer 248 and second storage layer 252 having a greater diameter than the first storage layer 250, the selection source 246 can magnetically saturate the selection layer 248 efficiently and provide access to one or both storage layers. The reduced diameter of the first storage layer 250 allows for the stationary positioning of the selection source 246 over the exposed portion of the selection layer 248, but it is contemplated that the selection source 246 travels laterally about the media 242 to saturate multiple different selection layers.

The stationary positioning of the selection source 246 allows ample room for a transducing assembly 254 to access the various portions of the media 242 to read and write data thereto with a transducing head 256. That is, an actuator arm 258 can translate the transducing head 256 to predetermined regions of the media 242, such as radial and circumferential tracks, to transfer data without concern for interfering with the selection source 246.

As can be appreciated, the media 242 can be configured with any number of data storage layers separated by selection layers. Such a media would have a corresponding number of different diameters to allow access to the various selection layers needed to individually read and write data to the storage layers. While multiple selection sources could be positioned over exposed areas of particular selection layers, a single selection source that translates laterally across the media 242 is also contemplated, as discussed above.

Figure 8:
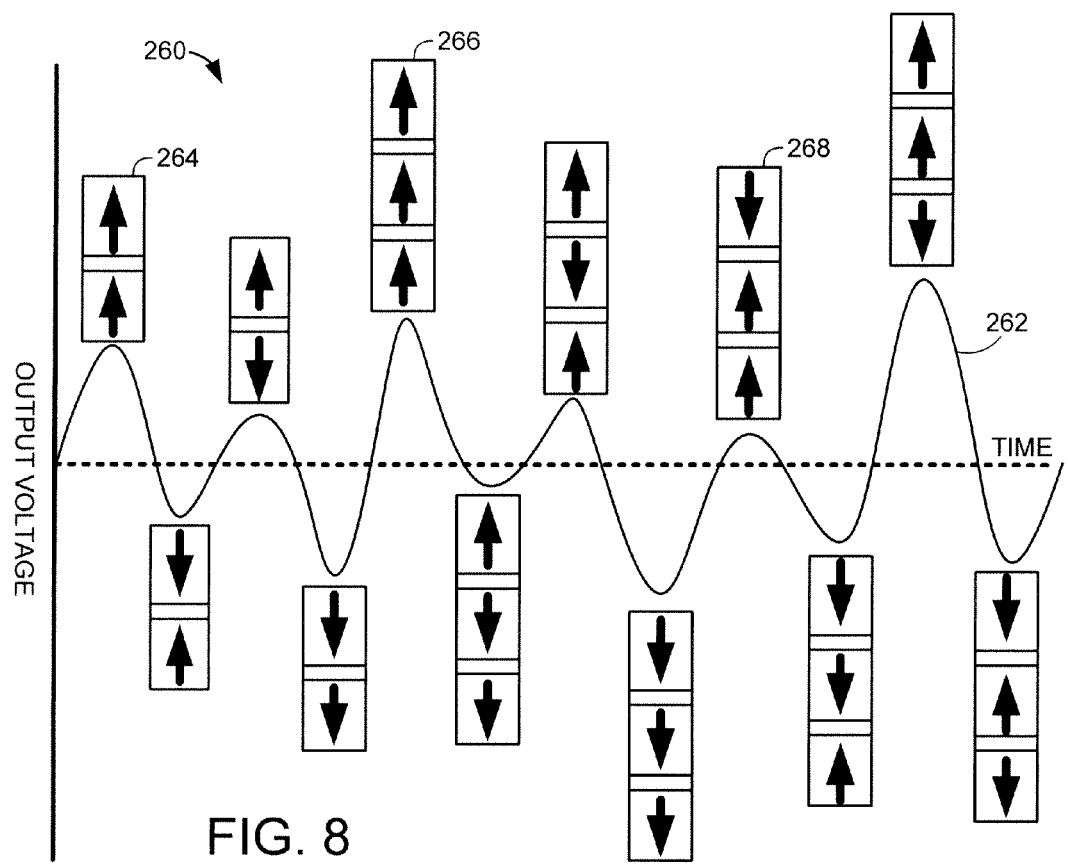
FIG. 8 graphs exemplary operational characteristics of the multi-bit memory of FIGS. 3A and 3B.

FIG. 8 graphs exemplary output characteristics of various multi-bit memory. The graph 260 generally illustrates possible output voltages and the corresponding multi-bit memory magnetic orientations of both dual bit and triple bit memory over time. Voltage 262 has positive and negative output voltages that can readily be translated into particular magnetic orientations, and corresponding logical states, of each bit in the memory. Analysis of the various voltages corresponding to the possible magnetic orientations of the multi-bit memory reveals that unique values are experienced for each combination of magnetic orientation to allow for efficient data reading.

Hence, when a value, such as the voltage corresponding to memory 264, is sensed from a data storage device, the value clearly indicates the magnetic orientation of each of the storage layers and the logical states of two bits of data. Such reading remains efficient and reliable with the inclusion of three bits as unique positive and negative voltages clarify which of the eight possible magnetic orientation configurations is present. As illustrated, memory 266 can be identified for three bits of data with a large positive voltage while the memory 268 has a unique positive voltage indicative of just one bit having a different magnetic orientation.

Figure 9:
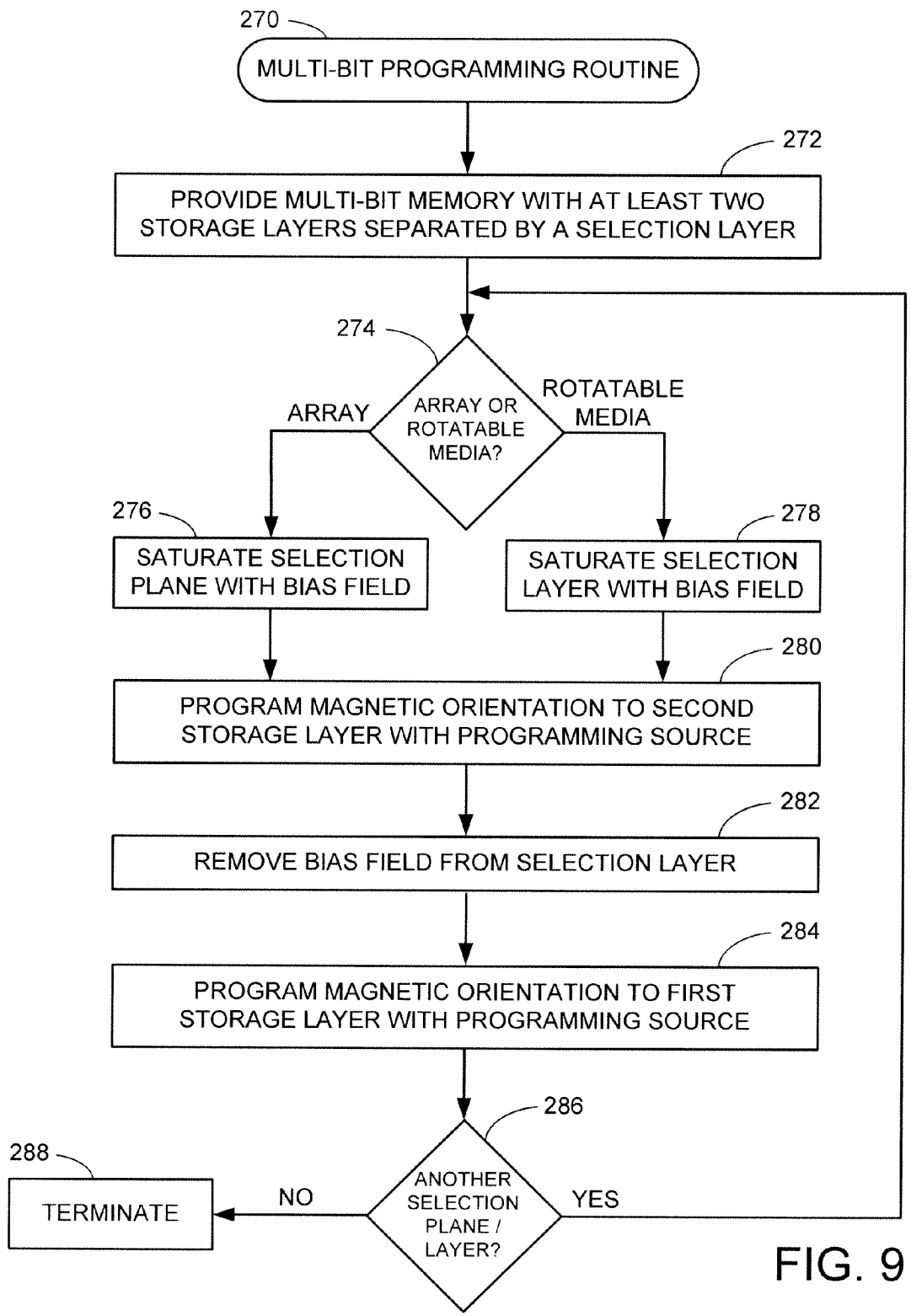
FIG. 9 provides a flowchart of an exemplary MULTI-BIT PROGRAMMING routine carried out in accordance with various embodiments of the present invention.

FIG. 9 provides an exemplary multi-bit programming routine 270 conducted in accordance with various embodiments of the present invention. The routine 270 begins with providing a multi-bit memory that has at least two storage layers attached to opposite sides of a selection layer in step 272. The provided memory is then evaluated in decision 274 to determine the structure of the selection layer. That is, an array of solid state multi-bit memory will have a selection plane, as provided in FIG. 6, while a rotatable media will have a selection layer, as shown in FIG. 7.

Determination of the multi-bit structure in decision 274 leads to saturation of a selection plane in step 276 or a selection layer in step 278 with a bias field produced from a selection source. Regardless of the determination in decision 274, magnetic saturation of the selection plane/layer allows the second storage layer to be accessed by a programming source for either data writing or reading. That access is utilized in step 280 to program a predetermined magnetic orientation to the second storage layer.

Afterward in step 282, the bias field from the selection source is removed and the low magnetic coercivity of the selection layer quickly removes access to the second storage layer. With magnetic reading and writing restricted to the first storage layer, step 284 programs the first storage layer with the programming source, if the magnetic orientation of the first storage layer is desired to be different than the orientation programmed to the second storage layer in step 280.

The routine 270 proceeds to decision 286 where the structure of the multi-bit memory is again evaluated to determine if multiple selection layers/planes are present. If another selection layer/plane is indeed part of the multi-bit memory, the routine 270 returns to decision 274 in which the selection structure is again analyzed and then saturated with bias force to allow for isolation and programming of another storage layer. The saturation and programming of storage layers continues with decision 286 until all storage layers are programmed to desired logical states.

Finally with no selection layers/planes remaining to be saturated, the routine 270 terminates at step 288. It should be noted that the various configurations of multi-bit memory, such as the dual and triple bit memories of FIGS. 3A and 3B, can be read and programmed with the routine 270 without following every step and decision shown in FIG. 9. The non-limited nature of the routine 270 is a product of the numerous possible selection layers and desired storage layer orientations that can be programmed individually or in combination in some situations.

For example, a triple bit memory with two selection layers will only need the selection layers saturated once if the two storage layers closest to the programming source are the same magnetic orientation. Thus, removal of bias force from the second selection layer will allow the top two storage layers to be concurrently programmed without isolating each storage layer in turn. Accordingly, the routine 270 of FIG. 9 is not required or limited and the various steps can be omitted, moved, or added, as desired.

Attention should further be brought to the numerical designation of storage layers. The storage layers are hereby to be understood to be designated according to proximity to the programming source. That is, the storage layer closest to the programming source is the first storage layer while the storage layer most distal to the programming source is the largest numerical storage layer. In such a manner, the second storage layer in a dual bit multi-bit memory will have the selection layer between the programming source and the second storage layer.

It can be appreciated that the configuration and material characteristics of the multi-bit memory described in the present disclosure allows for increased data storage capacity with minimal increase in physical size. The positioning of a magnetic selection layer with low magnetic coercivity disposed between storage layers with high magnetic coercivity allows for the isolation of storage layers for individual programming. Moreover, the addition of multiple bits does not affect the readability of the memory despite the numerous magnetic orientations due to the unique output voltages that allow for efficient determination of the programmed bits.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed. For example, the particular elements may vary depending on the particular application without departing from the spirit and scope of the present invention.

What is claimed is:

1. An apparatus comprising:
a first storage layer disposed between first and second selection layers each with low coercivity;
a second storage layer attached to the first selection layer, opposite the first storage layer; and
a third storage layer attached to the second selection layer, opposite the first storage layer, each storage layer configured with high coercivity, where magnetic saturation of both the first and second selection layers allows programming of a logical state to the third storage layer.

2. The apparatus of claim 1, wherein a first source programs the logical state, a second source saturates the first selection layer, and a third source saturates the second selection layer.

3. The apparatus of claim 1, wherein the first and second selection layers are respectively aligned with first and second sources.

4. The apparatus of claim 2, wherein the first storage layer is proximal to the first source, the second storage layer is proximal to the second source, and the second storage layer is distal to the first source so that the selection layer lies between the second storage layer and the first source.

5. The apparatus of claim 1, wherein the first, second, and third storage layers comprise a non-volatile memory cell capable of storing multiple logical states concurrently.

6. The apparatus of claim 5, wherein the first and second selection layers are part of respective first and second common planes that each interconnects multiple memory cells.

7. The apparatus of claim 5, wherein the first and second selection layers are each saturated by current running through the respective first and second common planes.

8. The apparatus of claim 6, wherein each memory cell has a programming source contactingly adjacent a storage layer.

9. The apparatus of claim 1, wherein the first and second selection layers each have selection magnetizations configured perpendicular to logical magnetizations of the first, second, and third storage layers.

10. The apparatus of claim 1, wherein the first storage layer has a first diameter, the second storage layer has a second diameter, and the third storage layer has a third diameter, the first diameter configured to be less than the second and third diameters, the second diameter being less than the third diameter.

11. The apparatus of claim 1, wherein saturation of the first and second selection layers is respectively with a bias magnetic field that is perpendicular to a program field that programs the logical state to the second storage layer.

12. A method comprising:
providing first, second, and third storage layers each configured with high coercivity and respectively separated by first and second selection layers each configured with a low coercivity; and
programming a logical state to the third storage layer in response to magnetic saturation of both the first and second selection layers.

13. The method of claim 12, wherein the first and second selection layers are magnetically saturated with magnetic bias fields that are removed to induce the first and second selection layers to magnetically shield the second and third storage layers.

14. The method of claim 12, wherein the first storage layer is programmed with the logical state while the first selection layer is not magnetically saturated.

15. The method of claim 12, wherein the logical state of the first, second, and third storage layers can concurrently be read in response to the magnetic saturation of the first and second selection layers.

16. An apparatus comprising:
first and second selection layers each with low coercivity respectively separating first, second, and third storage layers each with a high coercivity, the first storage layer being proximal to a program source; and
first and second selection sources that respectively magnetically saturate the first and second selection layers with magnetic fields, a saturation of the first and second selection layers allowing a program field from the program source to concurrently program a first logical state to the first, second, and third storage layers.

17. The apparatus of claim 16, wherein first storage layer is programmed to a second logical state in the absence of magnetic saturation of the first selection layer.

18. The apparatus of claim 17, wherein the second selection layer is configured with a coercivity that allows concurrent programming of the first logical state to each storage layer upon saturation.

19. The apparatus of claim 1, wherein the first, second, and third storage layers and the first and second selection layers comprise a multi-bit memory cell.

20. The apparatus of claim 2, wherein the first and second sources are aligned along different first and second planes, the first and second planes being orthogonal.

* * * * *